United States Patent [19]
Blalock et al.

[11] Patent Number: 5,213,659
[45] Date of Patent: May 25, 1993

[54] COMBINATION USAGE OF NOBLE GASES FOR DRY ETCHING SEMICONDUCTOR WAFERS

[75] Inventors: Guy T. Blalock, Boise; Scott Ludwig, Nampa, both of Id.

[73] Assignee: Micron Technology, Inc., Boise, Id.

[21] Appl. No.: 840,659

[22] Filed: Feb. 20, 1992

Related U.S. Application Data

[63] Continuation of Ser. No. 540,854, Jun. 20, 1990, abandoned.

[51] Int. Cl.⁵ .......................................... H01L 21/00
[52] U.S. Cl. ..................................... 156/643; 156/646; 156/657; 156/662
[58] Field of Search ............... 156/643, 646, 653, 657, 156/659.1, 662; 204/192.32, 192.37; 252/79.1

[56] References Cited

U.S. PATENT DOCUMENTS

| | | | |
|---|---|---|---|
| 4,465,552 | 8/1984 | Bobbio et al. | 156/659.1 |
| 4,595,452 | 6/1986 | Landau et al. | 156/659.1 |
| 4,666,555 | 5/1987 | Tsang | 156/659.1 |
| 4,741,799 | 5/1988 | Chen et al. | 156/657 |
| 4,904,341 | 2/1990 | Blaugher et al. | 156/646 |
| 5,013,398 | 5/1991 | Long et al. | 156/653 |
| 5,021,121 | 6/1991 | Groechel et al. | 156/659.1 |

Primary Examiner—Steven Weinstein
Assistant Examiner—Anthony Weier
Attorney, Agent, or Firm—Wells, St. John, Roberts, Gregory & Matkin

[57] ABSTRACT

A method of dry etching a layer on a semiconductor silicon substrate wafer within a reactor comprises:
  positioning a wafer within the reactor;
  injecting gases to within the reactor to provide a gas mixture at a preselected pressure, the gas mixture comprising at least two noble gases of different molecular weights which are present within the reactor at a preselected ratio relative to one another, one of the noble gases being defined as the lighter noble gas, another being defined as the heavier noble gas; and
  applying a preselected amount of electrical power to the reactor with the wafer therein for a preselected amount of time to selectively obtain a desired etch of the layer.

42 Claims, 1 Drawing Sheet

COMBINATION USAGE OF NOBLE GASES FOR DRY ETCHING SEMICONDUCTOR WAFERS

RELATED PATENT DATA

This patent resulted from a continuation application of U.S. patent application Ser. No. 07/540,854, filed Jun. 20, 1990 now abandoned.

TECHNICAL FIELD

This invention relates to dry etching of semiconductor silicon substrate wafers.

BACKGROUND OF THE INVENTION

Integrated circuits are formed on semiconductor silicon substrate wafers by a series of laying, patterning and doping steps. Patterning typically involves photolithography where a layer of photoresist is applied and then selectively removed in a masking step. This exposes those areas in the upper layer of the wafer which are to be removed or etched away.

The purpose of the etching operation is to remove portions of the top layer of the wafer through the holes, or openings, which are selectively formed in the photoresist layer. In this manner, the pattern of the photoresist mask is transferred to the top layer of the wafer. The etching operation should not disturb the underlying surface, and only remove material from the upper layer of the wafer.

Etching is typically performed with one of the following methods: wet (liquid) chemical etching, plasma etching, ion beam etching, or reactive ion etching (RIE). The term "dry etching" is a collective definition which includes any of plasma etching, ion beam etching or reactive ion etching. This disclosure concerns improved dry etching methods.

In a pure plasma etch, a high energy RF field induces gases injected into a reactor into the plasma state which causes a reaction with the exposed layer on the wafer. A pure ion beam etch, on the other hand, uses ion beams for removal of the exposed upper layer. In this method, the atoms of an inert gas (such as argon) are ionized by an RF field and directed towards the wafer. The positively charged atoms accelerate as they move toward the wafer. On impact, the top layer exposed through the photoresist is physically removed, or "blasted away" from the surface by the impinging ions.

Both the RIE method and ion beam removal method exhibit minimal undercutting beneath the photoresist. The terms "undercutting" and "isotropic etching" are synonymous and result in etching material to the side as well as in the downward direction. The term "anisotropic etching" defines an etch which removes material in only one direction. In order for an etch to be directional, there must be some directional (ion) component such as an ion beam. Plasma etch is an isotropic etch (i.e. no directionality). Pure ion beam etching promotes an anisotropic etch. However, both exhibit poor etch selectivity. "Selectivity" is a term which defines the removal of the underlying material or film. The better the selectivity for a given material, the less that material will be etched under given etch conditions. Where selectivity to the desired stop point of the etch is poor, the end point for the etch becomes critical in order to avoid overetching.

Reactive ion etching is a combination of plasma and ion beam removal at the wafer surface. The etching gas is injected into the reaction chamber and ionized. The individual molecules accelerate to the wafer surface. There, top layer removal is achieved by both physical bombardment and chemical action of the ions with the upper layer. The typical reactive ion etch employs a mixture of gases. The mixture will include one or more gases which are reactive with the surface, as well as a single inert or noble gas which provides the majority of the ion beam bombardment etching effect.

This combination bombardment/chemical etch results in an etch process that is more controllable. It also promotes improved sidewall passivation which results in an improved anisotropic etching effect. The reactive gases or etch by products form a polymer with the sidewalls of the opening as the etching proceeds down into the layer. The formation of this polymer film, termed "sidewall passivation", retards etching of the sidewall. It is removed in a later processing step after etching is completed.

As the individual components of integrated circuits get smaller, the openings in the photoresist layer for etching likewise become smaller. Reactive ion etching is credited with enabling somewhat reliable production where the opening size shrinks to about one micron wide. However, there is room for much improvement. For example, wider openings tend to etch at a different (typically higher) rate than which narrower openings are etched. This undesirable phenomenon is commonly referred to as "loading effects" due to the higher loading of components per unit area on the wafer. The goal is to achieve substantially uniform etching regardless of the size of the openings being etched, and thus that there be minimal loading effect.

In addition to uniformity of the etch regardless of opening size, it is desirable to achieve uniform etching across the surface of the wafer. Some etching gases produce a better anisotropic etching effect towards the edge of the wafer than they produce towards the center of the wafer. With such gases, the yield of usable chips at the center of the wafer is less than at the edge, thus reducing overall yield.

FIG. 1 is a diagrammatic fragmentary section illustration indicating poor center-to-edge etch uniformity in a semiconductor silicon wafer 10. FIG. 1 is a representative of an actual profile obtained of a reactive ion etch of an $SiO_2$ layer within a small gap (0.38 cm) Tegel TM 903E reactor. In the context of this document, the term "small gap" refers to a parallel plate reactor where the gap between the plates is less than or equal to 1 cm. The conditions were 600 watts of applied power and a pressure of 1750 mtorr, with the upper electrode being maintained at 45° C. and the lower electrode being maintained at 19° C. The injected gases were $SF_6$ at 6 sccm, $CHF_3$ at 45 sccm, and He at 130 sccm.

Wafer 10 is represented with an outer edge 12 and a central area 14. It is comprised of a doped monocrystalline substrate 16, polysilicon sections 18a and 18b, and an $SiO_2$ layer 20. A layer of photoresist 22 has been applied atop $SiO_2$ layer 20, and exposed to present openings 24 and 26. These were etched by the above mixture and produced the illustrated profile. As is apparent, the center-to-edge etching uniformity is poor. Hole 24 near edge 12 exhibits an acceptable profile, while hole 26 near center 14 exhibits a poor, unacceptable profile.

FIG. 2 illustrates an etch of a wafer of the same configuration, now designated with the numeral 30, using a different gas feed but otherwise under identical conditions. Here, the injected gas mixture consisted essentially of SF$_6$ at 6 sccm, CHF$_3$ at 45 sccm, and Ar at 130 sccm. As illustrated, center-to-edge uniformity is good. The profile of edge opening 24a was found to be substantially the same as the center etched opening 26a profile. However, the selectivity in both instances to the polysilicon 18a, 18b is very poor, as indicated by the jagged lines. The diameter of openings 24, 24a, 26, 26a referred to in the above experimental examples were each 0.8 microns.

A need remains for an improved dry etching method having good center-to-edge uniformity and good selectivity to the underlying layer.

BRIEF DESCRIPTION OF THE DRAWINGS

The preferred embodiment of the invention is illustrated by the accompanying drawings, in which.

DETAILED DESCRIPTION OF THE PREFERRED EMBODIMENTS

Figure 1:
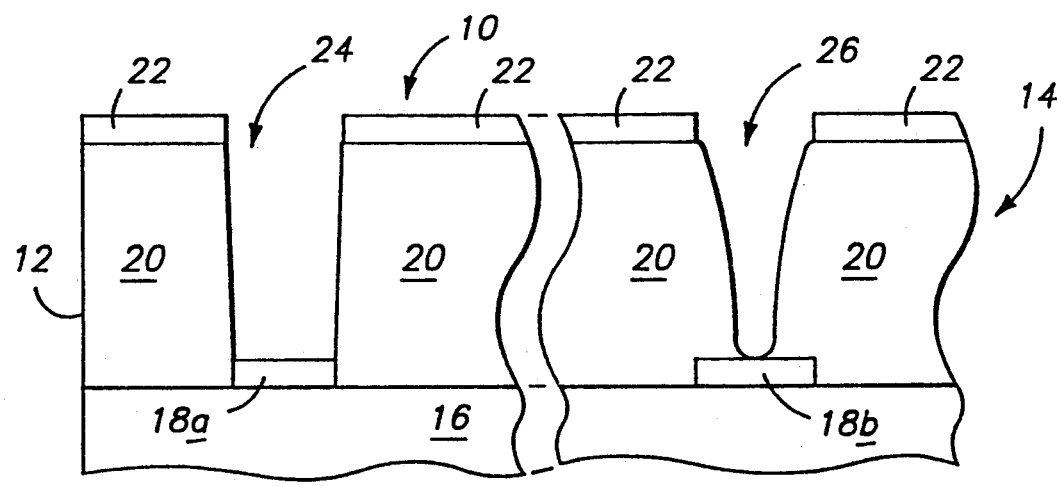
FIG. 1 is a fragmentary diagrammatic and exaggerated sectional view of a portion of a semiconductor silicon substrate wafer, and is discussed in the Background section above.

The following disclosure of the invention is submitted in furtherance with the constitutional purpose of the Patent Laws "to promote the progress of science and useful arts" (Article 1, Section 8).

Disclosed is a method of dry etching a layer on a semiconductor silicon substrate wafer within a reactor. The etch could be strictly a nonreactive ion beam etch or a reactive ion etch, with a reactive ion etch being preferred. The method provides for improved control of sidewall passivation, minimizing loading effects, and achieving improved uniformity from center to edge to produce an anisotropic etch of an unmasked area on a semiconductor silicon substrate wafer within a reactor. The method was reduced to practice, as described below, using a particular reactive ion etchant chemistry for etching a SiO$_2$ layer on a semiconductor silicon substrate wafer, with the etchant being selective to polysilicon.

The invention comprises injecting preselected quantities of at least two noble gases of different molecular weights into the reactor. For ease of discussion, one of the noble gases will be defined as the lighter noble gas, while the other will be defined as the heavier noble gas. It is to be understood, however that of course more than two gases might be injected into the reactor for taking advantage of the combinational effect of the etching profile of different weight noble gases.

It has been discovered that using a single inert gas as an ion beam etchant component limits the amount of control that may be established for the etch. However, by utilizing a ratio of two or more inert gases, better critical parameter control can be established. Lighter inert gases provide for control of etch rate and selectivity. Heavier inert gases promote uniform center-to-edge etchant profiles. Typically, the quantity of the lighter inert gas will be provided to exceed the quantity of the heavier inert gas to achieve a desired combinational effect.

In accordance with the method, the wafers would first be positioned within the reactor. The gases would be injected to within the reactor to provide a gas mixture at a preselected pressure and at desired preselected ratios. A preselected amount of electrical power would then be applied to the reactor for a preselected amount of time to selectively obtain a desired etch of the layer being etched. The preselected ratio of the lighter noble gas to the heavier noble gas is preferably from approximately 2:1 to 10:1 ±5% by volume, with 10:3 ±5% by volume being most preferred. The invention was reduced to practice, as discussed below, with the lighter noble gas being helium, and the heavier noble gas being argon.

The invention has its greatest advantages in the etching of openings (unmasked areas in the layer to be etched) which have a diameter of less than or equal to 1.0 micron. Prior art methods exhibit less than optimum uniformity where openings of less than one micron are being etched simultaneously with openings of greater than one micron. As such, the method provides for greater control and reliable production when etching openings of one micron diameter or less.

Figure 3:
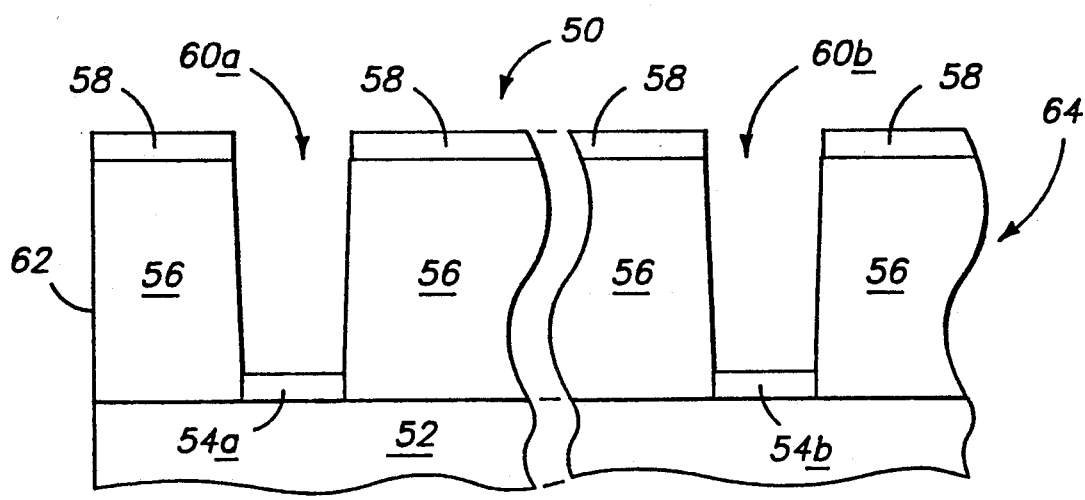
FIG. 3 is a fragmentary diagrammatic and exaggerated sectional view of a portion of a semiconductor silicon substrate wafer that has been etched in accordance with the invention.

The invention was reduced to practice using a Tegal TM 903E reactor having a set plate gap of 0.38 cm. The reactor was operated at 600 watts and 1750 mtorr, with the upper electrode being cooled to 45° C. and the lower electrode being cooled to 19° C. The etched substrate is illustrated in FIG. 3 and designated with the numeral 50.

Figure 2:
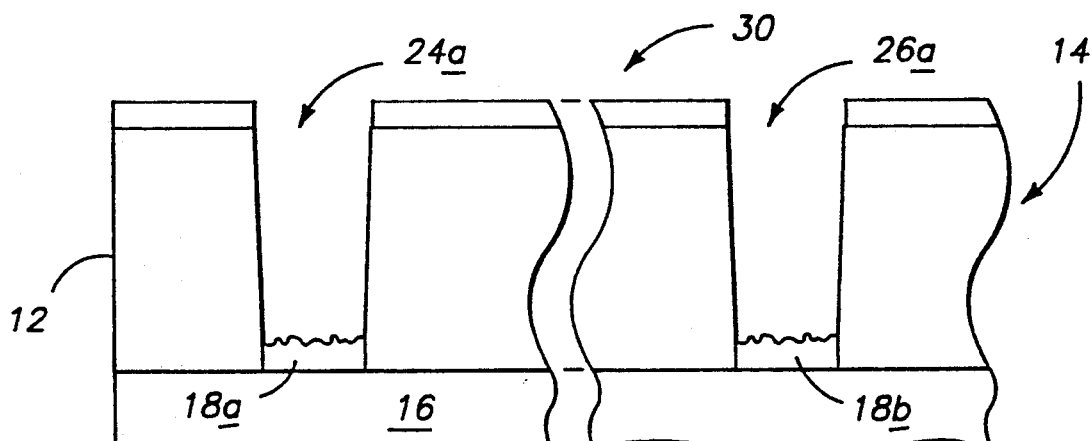
FIG. 2 is fragmentary diagrammatic and exaggerated sectional view of a portion of another semiconductor silicon substrate wafer, and is also discussed in the Background section above.

Wafer 50, like those of FIGS. 1 and 2, is comprised of a doped monocrystalline substrate 52; polysilicon sections 54a, 54b; SiO$_2$ layer 56; and a photoresist layer 58. Photoresist layer 58 has been exposed and stripped to define an opening 60a adjacent wafer outer edge 62, and an opening 60b adjacent wafer center 64. As represented by FIG. 3, a good anisotropic etch with good selectivity to polysilicon layers 54a and 54b, as well as good center-to-edge uniformity, was achieved. A uniform 88° profile was achieved with an etch rate of greater than or equal to 5000 angstroms per minute, and a selectivity to polysilicon of greater than or equal to 7:1.

The reactive gas chemistry which produced this profile consisted essentially of SF$_6$, CHF$_3$, He, and Ar at respective flow rates of 6 sccm, 50 sccm, 100 sccm, and 30 sccm. For such reactant chemistry for etching an SiO$_2$ layer which is selective to polysilicon, the preferred approximate volume ratio of SF$_6$ to CHF$_3$ is from 1:4 to 1:15 ±5%. The preferred respective volume ratios of SF$_6$, CHF$_3$, He, and Ar are 1.0 ±5%: 8.33 ±5%: 16.67 ±% 5: 5.0 ±5%. For a small gap parallel plate reactor such as the Tegel 903E, the preferred flow rate of SF$_6$ is between 4.0 and 8.0 sccm, the preferred flow rate of the CHF$_3$ is between 35.0 and 60.0 sccm, the preferred flow rate of the lighter noble gas is between 50.0 and 200.0 sccm, and the preferred flow rate of the heavier noble gas is between 10.0 and 50.0 sccm.

Table 1 below illustrates the loading effects on etching depth as being held below 10% for 0.8 micron and 0.55 micron diameter contact openings. The conditions were the same 600 watts, 1750 mtorr, with the upper electrode being maintained at 45° C. and the lower electrode being maintained at 19° C. The injected gases were SF$_6$ at 6 sccm, CHF$_3$ at 45 sccm, Ar at 30 sccm, and He at 100 sccm.

TABLE 1

Depth in Angstroms of Etching of Openings Employing a Contact Mask on Boron, Phosphorus Doped Silicon Glass Wafers

| Die Number | 1 Micron Diameter | 0.8 Micron Diameter | 0.55 Micron Diameter |
|---|---|---|---|
| 6 | 18033 | 16300 | (no reading) |
| 3 | 15657 | 16270 | 16000 |
| 1 | 15515 | 15750 | 15750 |

In compliance with the statute, the invention has been described in language more or less specific as to structural and methodical features. It is to be understood, however, that the invention is not limited to the specific features shown and described, since the means and construction herein disclosed comprise the preferred forms of putting the invention into effect. The invention is, therefore, claimed in any of its forms or modifications within the proper scope of the appended claims appropriately interpreted in accordance with the doctrine of equivalents.

We claim:

1. A method of dry etching an overlying layer on a semiconductor silicon substrate wafer selectively relative to an underlying layer within an etching reactor, the method comprising:

positioning said wafer within the etching reactor;

injecting gases to within the etching reactor to provide a gas mixture at a preselected pressure, the gas mixture comprising at least two noble gases of different molecular weights which are present within the etching reactor at a preselected ratio relative to one another, one of the noble gases being defined as the lighter noble gas, another being defined as the heavier noble gas, the preselected ratio of the lighter noble gas to that of the heavier noble gas being at least approximately 2:1 by volume; and applying a preselected amount of electrical power to the etching reactor with the wafer and preselected ratio of at least two noble gases therein for a preselected amount of time to selectively obtain a desired etch of the overlying layer, the etch producing high wafer center-to-edge etch uniformity and being highly selective to the underlying layer.

2. The dry etching method of claim 1 wherein the preselected ratio of the lighter noble gas to the heavier noble gas is from approximately 2:1 to 10:1, ±5% by volume.

3. The dry etching method of claim 1 wherein the preselected ratio of the lighter noble gas to the heavier noble gas is approximately 10:3 ±5% by volume.

4. The dry etching method of claim 1 wherein the lighter noble gas is helium and the heavier noble gas is argon, the preselected ratio of helium to argon being from approximately 2:1 to 10:1, ±5% by volume.

5. The dry etching method of claim 4 wherein the preselected ratio of helium to argon is approximately 10:3 ±5% by volume.

6. The dry etching method of claim 1 consisting essentially of a nonreactive ion beam etch.

7. The dry etching method of claim 6 wherein the preselected ratio of the lighter noble gas to the heavier noble gas is from approximately 2:1 to 10:1, ±5% by volume.

8. The dry etching method of claim 6 wherein the lighter noble gas is helium and the heavier noble gas is argon, the preselected ratio of helium to argon being from approximately 2:1 to 10:1, ±5% by volume.

9. The dry etching method of claim 6 wherein the lighter noble gas is helium and the heavier noble gas is argon, the preselected ratio of helium to argon being approximately 10:3 ±5% by volume.

10. The dry etching method of claim 1 consisting essentially of a reactive ion beam etch.

11. The dry etching method of claim 10 wherein the preselected ratio of the lighter noble gas to the heavier noble gas is from approximately 2:1 to 10:1, ±5% by volume.

12. The dry etching method of claim 10 wherein the lighter noble gas is helium and the heavier noble gas is argon, the preselected ratio of helium to argon being from approximately 2:1 to 10:1, ±5% by volume.

13. The dry etching method of claim 10 wherein the lighter noble gas is helium and the heavier noble gas is argon, the preselected ratio of helium to argon being approximately 10:3 ±5% by volume.

14. The dry etching method of claim 1 further comprising preparing the layer to be etched by photomasking to provide at least one unmasked area in the layer to be etched having a diameter of less than or equal to 1.0 micron.

15. The dry etching method of claim 14 wherein the preselected ratio of the lighter noble gas to the heavier noble gas is from approximately 2:1 to 10:1, ±5% by volume.

16. The dry etching method of claim 14 wherein the lighter noble gas is helium and the heavier noble gas is argon, the preselected ratio of helium to argon being from approximately 2:1 to 10:1, ±5% by volume.

17. The dry etching method of claim 14 wherein the lighter noble gas is helium and the heavier noble gas is argon, the preselected ratio of helium to argon being approximately 10:3 ±5% by volume.

18. A method of controlling sidewall passivation, minimizing loading effects, improving etch selectivity to an underlying layer and achieving improved uniformity from center to edge in an anisotropic reactive gas ion beam etch within a parallel plate etching reactor of an unmasked area of an overlying layer relative to an underlying layer on a semiconductor silicon substrate wafer, the method comprising:

with said wafer in the reactor, injecting preselected quantities of at least two noble gases of different molecular weights into the etching reactor along with reactive gases, one of the noble gases being defined as the lighter noble gas, another being defined as the heavier noble gas, the quantity of the lighter noble gas exceeding the quantity of the heavier noble gas by a ratio of at least approximately 2:1 by volume.

19. The method of claim 18 wherein the quantities of the lighter noble gas and heavier noble gas are selected to provide an approximate 2:1 to 10:1, ±5% by volume ratio of lighter gas to heavier gas.

20. The method of claim 18 wherein the quantities of the lighter noble gas and heavier noble gas are selected to provide an approximate 10:3 ±5% by volume ratio of lighter gas to heavier gas.

21. The method of claim 18 wherein the lighter noble gas is helium and the heavier noble gas is argon, the quantities of helium and argon being selected to provide an approximate 2:1 to 10:1, ±5% by volume ratio of helium to argon.

22. The method of claim 21 wherein the ratio of helium to argon is approximately 10:3 ±5% by volume.

23. The method of claim 18 further comprising providing at least one unmasked area to be etched on the wafer having a diameter of less than or equal to 1.0 micron.

24. The method of claim 23 wherein the quantities of the lighter noble gas and heavier noble gas are selected to provide an approximate 2:1 to 10:1, ±5% by volume ratio of lighter gas to heavier gas.

25. The method of claim 23 wherein the lighter noble gas is helium and the heavier noble gas is argon, the quantities of helium and argon being selected to provide an approximate 2:1 to 10:1, ±5% by volume ratio of helium to argon.

26. A method of reactive ion etching a $SiO_2$ overlying layer on a semiconductor silicon substrate wafer selectively relative to an underlying polysilicon layer within an etching reactor, the method comprising:

positioning said wafer within the etching reactor;

injecting gases to within the etching reactor to provide a gas mixture at a preselected pressure, the gas mixture within the reactor comprising $SF_6$ and $CHF_3$ at an approximate respective volume ratio of from 1:4 to 1:15, ±5%, and at least two noble gases of different molecular weights, one of the noble gases being defined as the lighter noble gas, another being defined as the heavier noble gas, the lighter noble gas and heavier noble gas being present at an approximate respective volume ratio of from 2:1 to 10:1, ±5%; and applying a preselected amount of electrical power to the etching reactor with the wafer and preselected ratio of at least two noble gases therein for a preselected amount of time to selectively obtain a desired etch of the $SiO_2$ layer, the etch producing high wafer center-to-edge etch uniformity and being highly selective to the underlying polysilicon layer.

27. The reactive ion etching method of claim 26 wherein the ratio of the lighter noble gas to the heavier noble gas is approximately 10:3 ±5%.

28. The reactive ion etching method of claim 26 wherein the lighter noble gas is helium and the heavier noble gas is argon.

29. The reactive ion etching method of claim 28 wherein the ratio of the helium to argon is approximately 10:3 ±5%.

30. The reactive ion etching method of claim 26 wherein the respective volume ratios of $SF_6$, $CHF_3$, lighter noble gas, and heavier noble gas are 1.0 ±5%: 8.33 ±5%: 16.67 ±5%: 5.0 ±5%.

31. The reactive ion etching method of claim 30 wherein the lighter noble gas is helium and the heavier noble gas is argon.

32. The reactive ion etching method of claim 26 further comprising preparing the $SiO_2$ layer by photomasking to provide at least one unmasked area in the $SiO_2$ layer to be etched having a diameter of less than or equal to 1.0 micron.

33. The reactive ion etching method of claim 32 wherein the lighter noble gas is helium and the heavier noble gas is argon.

34. The reactive ion etching method of claim 32 wherein the lighter noble gas is helium and the heavier noble gas is argon, and the respective volume ratios of $SF_6$, $CHF_3$, helium, and argon are 1.0 ±5%: 8.33 ±5%: 16.67 ±5%: 5.0 ±5%.

35. A method of reactive ion etching a $SiO_2$ overlying layer on a semiconductor silicon substrate wafer selectively relative to an underlying polysilicon layer within a small gap parallel plate etching reactor, the method comprising:

positioning said wafer within the etching reactor;

injecting $SF_6$, $CHF_3$, and at least two different molecular weight noble gases into the etching reactor at preselected flow rates, one of the noble gases being defined as the lighter noble gas, another being defined as the heavier noble gas; the flow rate of the $SF_6$ being between 4.0 and 8.0 sccm, the flow rate of the $CHF_3$ being between 35.0 and 60.0 sccm, the flow rate of the lighter noble gas being between 50.0 and 200.0 sccm, and the flow rate of the heavier noble gas being between 10.0 and 50.0 sccm; the lighter noble gas and heavier noble gas being injected at an approximate respective volume ratio rate of from 2:1 to 10:1, ±5%; and applying a preselected amount of electrical power to the etching reactor with the wafer and preselected ratio of at least two noble gases therein for a preselected amount of time to selectively obtain a desired etch of the $SiO_2$ layer, the etch producing high wafer center-to-edge etch uniformity and being highly selective to the underlying polysilicon layer.

36. The reactive ion etching method of claim 35 wherein the respective flow rates of $SF_6$, $CHF_3$, lighter noble gas, and heavier noble gas are 6.0 ±5% sccm, 50.0 ±5% sccm, 100.0 ±5% sccm, and 30.0 ±5% sccm.

37. The reactive ion etching method of claim 35 wherein the lighter noble gas is helium and the heavier noble gas is argon.

38. The reactive ion etching method of claim 37 wherein the respective flow rates of $SF_6$, $CHF_3$, helium, and argon are 6.0 ±5% sccm, 50.0 ±5% sccm, 100.0 ±5% sccm, and 30.0 ±5% sccm.

39. The reactive ion etching method of claim 35 further comprising preparing the $SiO_2$ layer by photomasking to provide at least one unmasked area in the $SiO_2$ layer to be etched having a diameter of less than or equal to 1.0 micron.

40. The reactive ion etching method of claim 35 further comprising preparing the $SiO_2$ layer by photomasking to provide at least one unmasked area in the $SiO_2$ layer to be etched having a diameter of less than or equal to 1.0 micron; and wherein the respective flow rates of $SF_6$, $CHF_3$, lighter noble gas, and heavier noble gas are 6.0 ±5% sccm, 50.0 ±5% sccm, 100.0 ±5% sccm, and 30.0 ±5% sccm.

41. The reactive ion etching method of claim 35 further comprising preparing the $SiO_2$ layer by photomasking to provide at least one unmasked area in the $SiO_2$ layer to be etched having a diameter of less than or equal to 1.0 micron; and wherein the lighter noble gas is helium and the heavier noble gas is argon.

42. The reactive ion etching method of claim 41 wherein the respective flow rates of $SF_6$, $CHF_3$, helium, and argon are 6.0 ±5% sccm, 50.0 ±5% sccm, 100.0 ±5% sccm, and 30.0 ±5% sccm.

* * * * *